(12) United States Patent
Jung et al.

(10) Patent No.: US 8,717,821 B2
(45) Date of Patent: May 6, 2014

(54) NONVOLATILE MEMORY DEVICE AND METHOD OF PROGRAMMING THE SAME

(75) Inventors: Min Joong Jung, Gyeonggi-do (KR); Seong Je Park, Gyeonggi-do (KR); Jung Mi Shin, legal representative, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 256 days.

(21) Appl. No.: 13/244,217

(22) Filed: Sep. 23, 2011

(65) Prior Publication Data

US 2012/0163092 A1    Jun. 28, 2012

(30) Foreign Application Priority Data

Oct. 26, 2010    (KR) .................. 10-2010-0104854

(51) Int. Cl.
*G11C 16/04*    (2006.01)
(52) U.S. Cl.
USPC ............... 365/185.19; 365/211; 365/185.22
(58) Field of Classification Search
USPC ................. 365/185.19, 211, 185.22
See application file for complete search history.

(56) References Cited

U.S. PATENT DOCUMENTS

| 7,593,277 | B2 * | 9/2009 | Chan et al. ............ 365/210.11 |
| 8,472,245 | B2 * | 6/2013 | Kim .................. 365/185.03 |
| 2005/0169082 | A1 * | 8/2005 | Cernea ................... 365/218 |
| 2007/0109847 | A1 * | 5/2007 | Cernea et al. ........... 365/185.2 |
| 2011/0292724 | A1 * | 12/2011 | Kim .................. 365/185.03 |

FOREIGN PATENT DOCUMENTS

KR    1020070080037    8/2007

OTHER PUBLICATIONS

Office Action issued by the Korean Intellectual Property Office on Dec. 26, 2011.

* cited by examiner

*Primary Examiner* — Tuan T. Nguyen
(74) *Attorney, Agent, or Firm* — IP & T Group LLP

(57) ABSTRACT

The program method of a nonvolatile memory device includes detecting temperature, setting a step voltage, corresponding to an increment of a program voltage in a program operation of an incremental step pulse program (ISPP) method, wherein the step voltage changes based on the detected temperature, and performing the program operation and a program verification operation based on the set step voltage.

10 Claims, 3 Drawing Sheets

NONVOLATILE MEMORY DEVICE AND METHOD OF PROGRAMMING THE SAME

CROSS-REFERENCE TO RELATED APPLICATION

Priority to Korean patent application number 10-2010-0104854 filed on Oct. 26, 2010, the entire disclosure of which is incorporated by reference herein, is claimed.

BACKGROUND

Exemplary embodiments relate to a nonvolatile memory device and a method of programming the same.

Recently, there is an increasing demand for nonvolatile memory devices which can be electrically programmed and erased and which do not require a refresh function of rewriting data at specific intervals.

The nonvolatile memory device can be electrically programmed and erased in such a manner that electrons within an oxide layer migrate in response to a strong electric field applied to the oxide layer, thereby shifting the threshold voltages of memory cells.

The nonvolatile memory devices may be typically used in mobile devices, and thus it is necessary to develop technology in which the same characteristic can be maintained despite a change of temperature. After a program operation for the memory cells of the nonvolatile memory device, a program verification operation is performed. A sense current used as a reference current in the program verification operation may be sensitive to a change of temperature. In particular, if the program operation and the program verification operation are performed at low temperature, a change of the sense current is increased to widen a threshold voltage distribution of the memory cells. Accordingly, there has been a need for technology capable of preventing the phenomenon in which the threshold voltage distribution of memory cells may be widened at low temperature.

BRIEF SUMMARY

According to exemplary embodiments, even though a program operation of an Incremental Step Pulse Program (ISPP) method and a program verification operation are performed at low temperature, the threshold voltage distribution of memory cells is not widened.

The program method of a nonvolatile memory device according to an exemplary aspect of the present disclosure includes detecting temperature, setting a step voltage, corresponding to an increment of a program voltage in a program operation of an incremental step pulse program (ISPP) method, wherein the step voltage changes based on the detected temperature, and performing the program operation and a program verification operation based on the set step voltage.

The step voltage may be set to a lower step voltage than a previous step voltage according to a decrease in the detected temperature.

Performing the program operation and the program verification operation may include performing a first program operation by supplying a first program voltage to a word line coupled to memory cells, performing a first program verification operation by comparing a target threshold voltage and threshold voltages of the memory cells, and performing a second program operation by supplying the word line with a second program voltage higher than the first program voltage by the step voltage.

Setting the step voltage may include, when the detected temperature is lower than a first temperature value, setting a first step voltage as the step voltage, and, when the detected temperature is the first temperature value or higher, setting a second step voltage, which is higher than the first step voltage, as the step voltage.

A nonvolatile memory device according to another exemplary aspect of the present disclosure includes a memory cell block including memory cells coupled to each of word lines, an operation circuit group configured to perform a program operation of an ISPP method and a program verification operation for the memory cells, and a control circuit configured to set a step voltage, corresponding to an increment of a program voltage in the program operation, wherein the step voltage changes based on a detected temperature and to control the operation circuit group so that the program operation and the program verification operation are performed based on the set step voltage.

The control circuit may set the step voltage to a lower step voltage than the previous step voltage according to a decrease in the detected temperature.

The nonvolatile memory device may further include a temperature sensing circuit for detecting the temperature.

The control circuit may control the operation circuit group such that a first program operation and a program verification operation are performed by supplying a first program voltage to the word line and a second program operation and a program verification operation are performed by supplying the word line with a second program voltage, which is higher than the first program voltage by the step voltage.

The control circuit may set a first step voltage as the step voltage when the detected temperature is lower than a first temperature value and set a second step voltage, which is higher than the first step voltage, as the step voltage when the detected temperature is the first temperature value or higher.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Nonvolatile Memory Device

Figure 1:
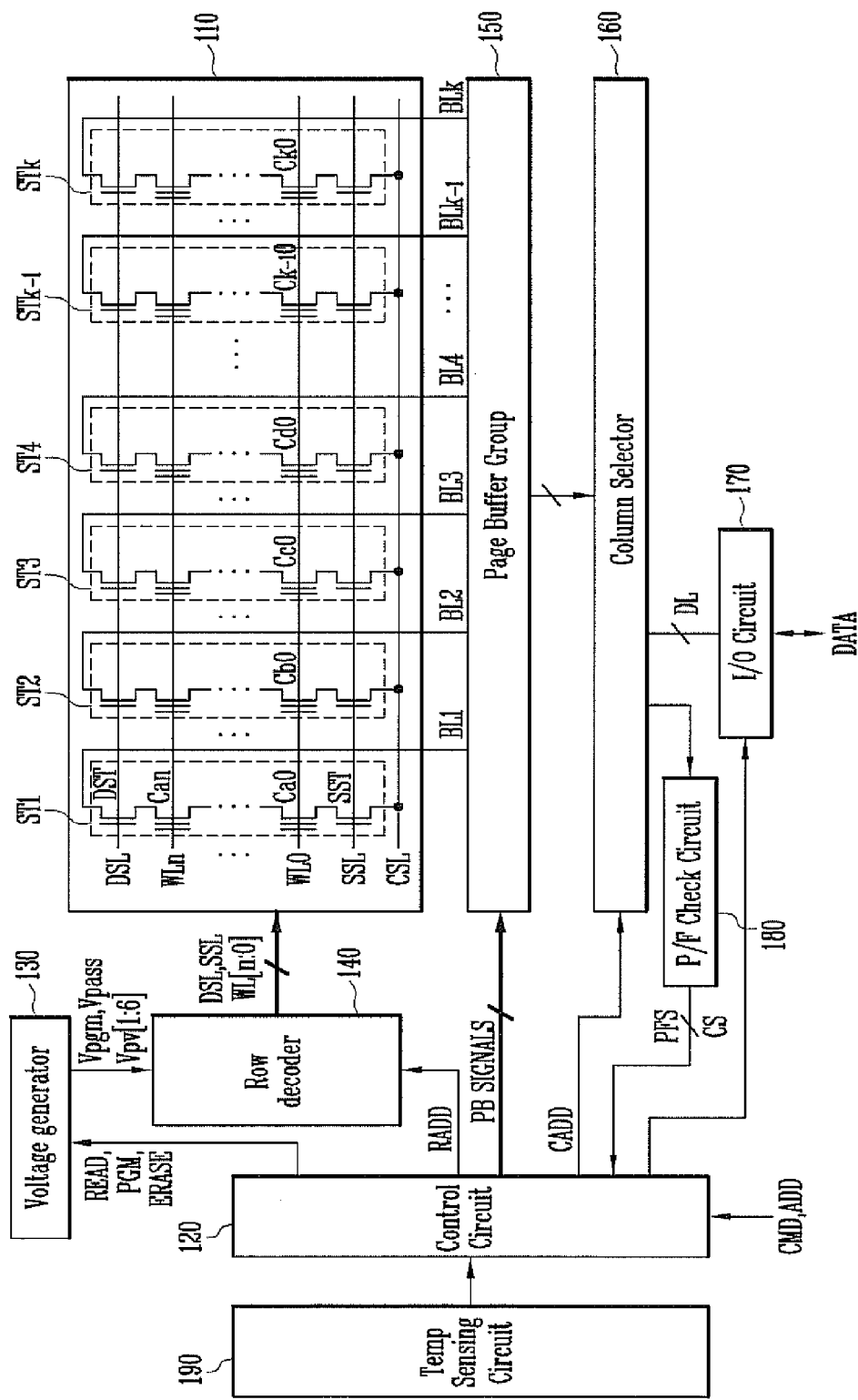
FIG. 1 is a diagram illustrating the configuration of a nonvolatile memory device according to an exemplary embodiment of this disclosure.

FIG. 1 is a diagram illustrating the configuration of a nonvolatile memory device according to an exemplary embodiment of this disclosure.

Referring to FIG. 1, the nonvolatile memory device according to the exemplary embodiment of this disclosure includes a memory cell block 110, an operation circuit group 130, 140, 150, 160, 170, and 180 configured to perform a program operation of an Incremental Step Pulse Program (ISPP) method and a program verification operation for memory cells included in the memory cell block 110, a control circuit 120 configured to control the operation circuit group 130, 140, 150, 160, 170, and 180, and a temperature sensing circuit 190 configured to sense temperature.

In the case of a NAND flash memory device, the operation circuit group includes a voltage generator 130, a row decoder 140, a page buffer group 150, a column selector 160, an I/O circuit 170, and a pass/fail (P/F) check circuit 180.

A memory cell array includes a plurality of memory cell blocks. FIG. 1 shows one 110 of the memory cell blocks. The memory cell block 110 includes a plurality of strings ST1 to STk. Each, for example, ST1, of the strings includes a source select transistor SST coupled to a common source line CSL, a plurality of memory cells Ca0 to Can, and a drain select transistor DST coupled to a bit line BL1. The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to the respective bit lines BL1 to BLk and are commonly coupled to the common source line CSL.

The control circuit 120 internally generates a program operation signal PGM, a read operation signal READ, or an erase operation signal ERASE in response to a command signal CMD and also generates control signals PB SIGNALS for controlling the page buffers (not shown) of the page buffer group 150 according to a type of the operation. Furthermore, the control circuit 120 internally generates a row address signal RADD and a column address signal CADD in response to an address signal ADD. The control circuit 120 of this disclosure controls the operation circuit group 130, 140, 150, 160, 170, and 180 so that a program operation of an ISPP method and a program verification operation can be performed. The control circuit 120 functions to set an increment, for example, a step voltage, of a program voltage in the program operation of an ISPP method according to temperature sensed by the temperature sensing circuit 190.

A voltage supply circuit 130 and 140 supplies the drain select line DSL, the word lines WL0 to WLn, and the source select line SSL of the memory cell block 110 with operating voltages for the program operation, the erase operation, and the read operation of memory cells in response to the signals READ, PGM, ERASE, and RADD generated by the control circuit 120. The voltage supply circuit includes the voltage generator 130 and the row decoder 140. The voltage supply circuit 130 and 140 also supplies the program voltage for a program operation to the word lines WL0 to WLn.

The voltage generator 130 outputs the operating voltages for programming, reading, and erasing memory cells to global lines in response to the signals PGM, READ, and ERASE, for example, internal command signals, of the control circuit 120 and also outputs operating voltages, for example, Vpgm, Vpass, and Vpv[1:6], to the global lines when memory cells are programmed.

The row decoder 140 transfers the operating voltages of the voltage generator 130 to the strings ST1 to STk of the memory cell block 110 in response to the row address signal RADD of the control circuit 120.

The page buffer group 150 includes the page buffers (not shown) coupled to the respective bit lines BL1 to BLk. The page buffer group 150 supplies the bit lines BL1 to BLk with respective voltages necessary to store data in the memory cells Ca0 to Ck0 in response to the control signals PB SIGNALS of the control circuit 120.

The column selector 160 selects the page buffers of the page buffer group 150 in response to the column address signal CADD of the control circuit 120 and outputs data latched in the selected page buffers.

The I/O circuit 170 transfers external data DATA to the column selector 160 under the control of the control circuit 120 in a program operation so that the data is inputted to the page buffer group 150.

The P/F check circuit 180 checks whether an error cell having a threshold voltage lower than a target voltage exists in programmed memory cells during a program verification operation performed after a program operation, and outputs a result of the check as a check signal PFS. Furthermore, the P/F check circuit 180 counts the number of error cells, and outputs a result of the count as a check signal CS.

The nonvolatile memory device of this disclosure includes the temperature sensing circuit 190 for sensing temperature. Temperature sensed by the temperature sensing circuit 190 is used for the control circuit 120 to set a step voltage which is an increment of a program voltage in the program operation of an ISPP method. This is described in detail below.

Program Operation and Program Verification Operation

Figure 2:
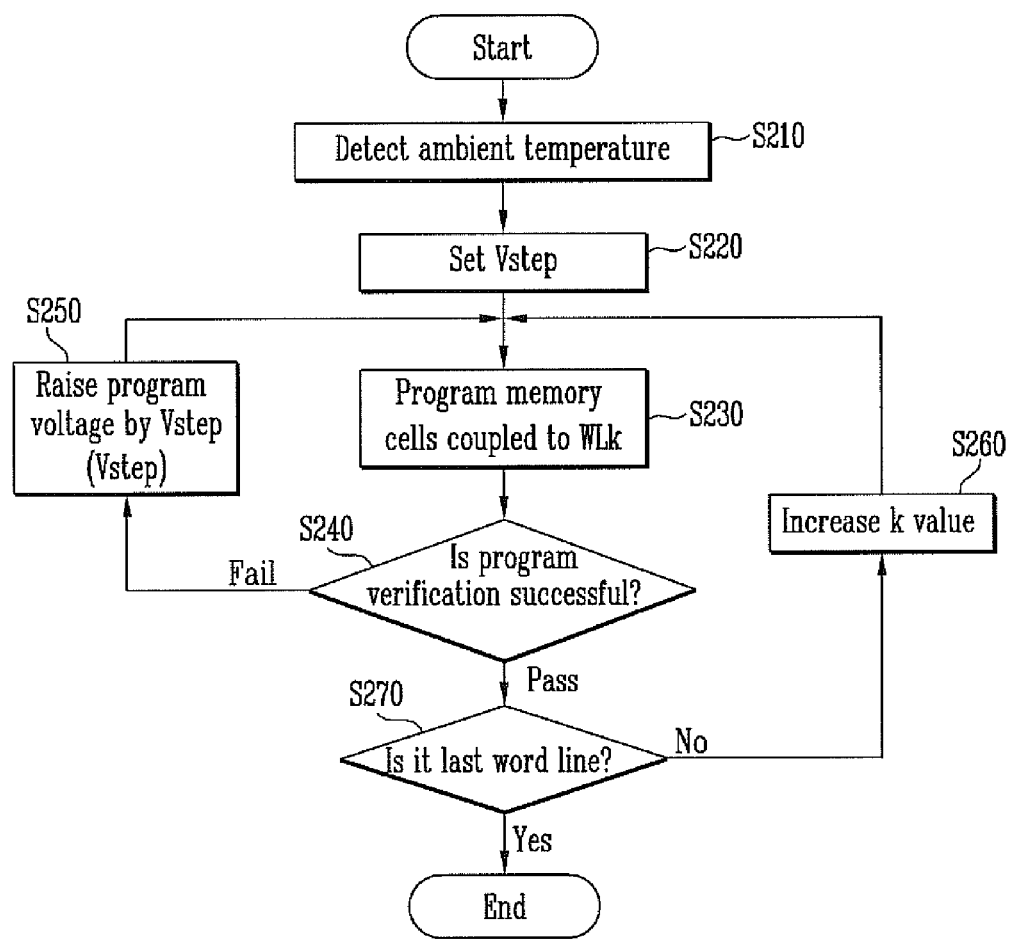
FIG. 2 is a diagram illustrating a process of the program operation and the program verification operation of the nonvolatile memory device according to an exemplary embodiment of this disclosure.
Figure 3A:
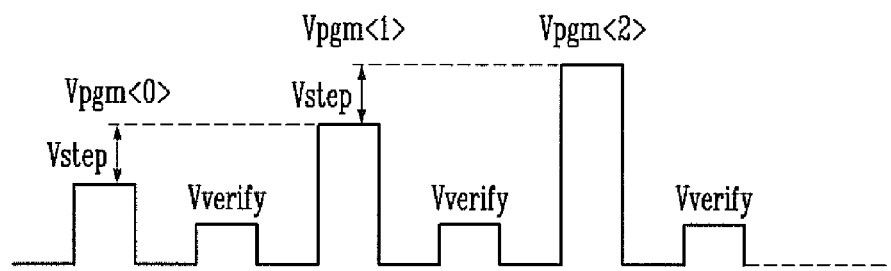
FIGS. 3A and 3B are diagrams illustrating a shift in a program voltage used in a known nonvolatile memory device and a shift in a program voltage used in a nonvolatile memory device in accordance with the exemplary embodiments of this disclosure at low temperature.
Figure 3B:
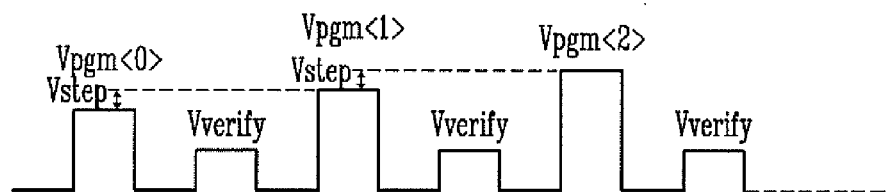

FIG. 2 is a diagram illustrating a process of the program operation and the program verification operation of the nonvolatile memory device according to an exemplary embodiment of this disclosure. FIGS. 3A and 3B are diagrams illustrating a shift in a program voltage used in the program operation of a known nonvolatile memory device and a shift in a program voltage used in the program operation of the nonvolatile memory device in accordance with an exemplary embodiment of this disclosure when temperature is lower than a reference temperature, which is, for example, a common temperature.

A process of the program operation and the program verification operation of the nonvolatile memory device according to the exemplary embodiment of this disclosure is described with reference to FIGS. 1 to 3.

First, the temperature sensing circuit 190 detects ambient temperature at step S210. To this end, the temperature sensing circuit 190 may include a specific type of temperature sensor. After the temperature is detected by the temperature sensing circuit 190, the control circuit 120 sets an increment, for example, a step voltage Vstep, of a program voltage in a program operation of an ISPP method based on the detected temperature at step S220.

In general, at low temperature, since a change of a sense current used in a program verification operation is increased, the entire threshold voltage distribution of memory cells may be widened. In this case, the control circuit 120 sets a lower step voltage Vstep according to a decrease in detected temperature in order to prevent the threshold voltage distribution of the memory cells from being widened according to the repetition of program operations and program verification operations.

For example, when the detected temperature is less than a first temperature value, the control circuit 120 may select a first step voltage as an increment of the program voltage in the program operation of an ISPP method. When the detected temperature is the first temperature value or higher, but lower than a second temperature value, the control circuit 120 may select a second step voltage, which is higher than the first step voltage, as the increment of the program voltage. Furthermore, when the detected temperature is the second temperature value or higher, the control circuit 120 may select a third step voltage, which is higher than the second step voltage, as the increment of the program voltage in the program operation of an ISPP method. The control circuit 120 may not only set the step voltage Vstep, but also a program start voltage in the program operation of an ISPP method.

Next, a program operation for memory cells coupled to a word line, for example, WLk, is performed at step S230. The program operation is performed by supplying a program start voltage Vpgm<0> to the word line WLk. The program start voltage Vpgm<0> may be a value set by the control circuit 120. The value may be a common program start voltage, but may be set according to detected temperature.

After the program operation, a program verification operation is performed at step S240. The program verification operation is performed in order to determine whether the memory cells have threshold voltages higher than a target threshold voltage by supplying a verification voltage Vverify to the word line WLk. Here, a sense current may be supplied to the memory cells. A change of the sense current is increased at lower temperature.

If, as a result of the program verification operation, the program operation has not been normally performed, the program voltage is raised by the set step voltage Vstep at step S250. The step voltage Vstep is set by the control circuit 120. As described above, the step voltage Vstep has a lower value according to lower temperature. Referring to FIGS. 3A and 3B, it can be seen that, when a detected temperature is lower than typical ambient temperature, a step voltage Vstep in the ISPP method according to an exemplary embodiment of this disclosure is smaller than a step voltage Vstep in a known ISPP method.

After the program voltage is raised by the step voltage Vstep, the program operation at step S230 and the program verification operation at step S240 are performed again using the raised program voltage Vpgm<1>.

If, as a result of the program verification operation at step S240, the memory cells have been normally programmed, it is determined whether the word line WLk to which the memory cells are coupled is the last word line at step S260. If, as a result of the determination, the word line WLk is determined not to be the last word line, a k value indicating a word line is increased at step S270. The program operation and the program verification operation for a next word line WLk are performed as described above.

Figure 4A:
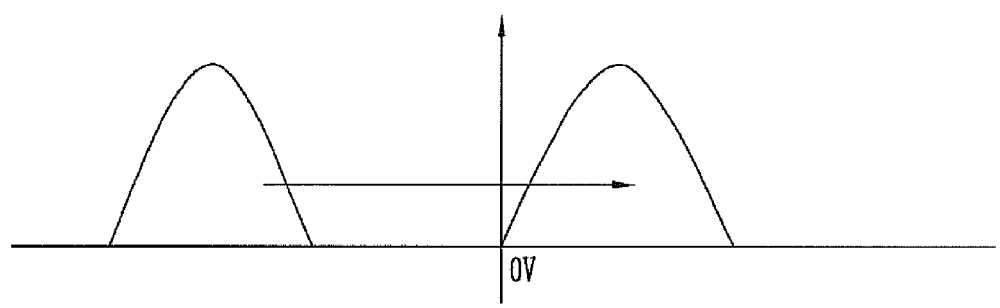
FIGS. 4A and 4B are diagrams illustrating threshold voltage distributions of the memory cells of a known nonvolatile memory device and of the memory cells of a nonvolatile memory device in accordance with the exemplary embodiments of this disclosure at low temperature.
Figure 4B:
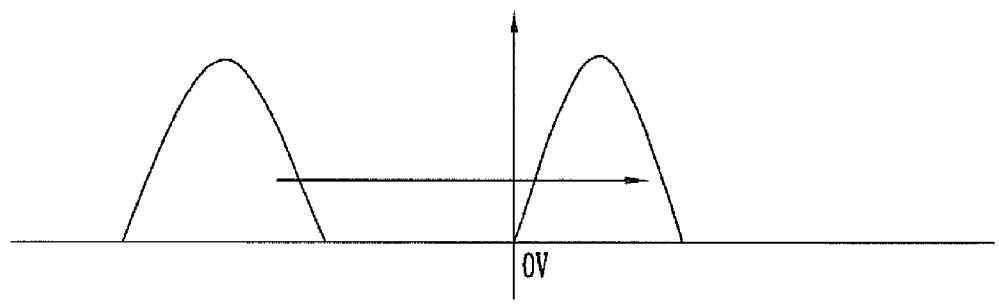

FIGS. 4A and 4B show the threshold voltage distributions of all memory cells of a known nonvolatile memory device and of the nonvolatile memory device of this disclosure, which are results of program operations when a detected temperature is lower than typical ambient temperature.

Referring to FIG. 4A, it can be seen that, in the known nonvolatile memory device, a change of a sense current supplied to the memory cells may be increased when a temperature is low because a constant step voltage is used in the program operation of an ISPP method irrespective of the temperature, and thus the entire threshold voltage distribution of the memory cells may be widened. However, FIG. 4A shows that, in the nonvolatile memory device in accordance with an exemplary embodiment of this disclosure, the entire threshold voltage distribution of the memory cells is narrower than that of the known art because a lower step voltage is used according to lower temperature.

As described above, according to the present disclosure, a step voltage in a program operation of an ISPP method is set to be lower according to lower temperature. Accordingly, a phenomenon in which the entire threshold voltage distribution of memory cells is widened can be prevented.

What is claimed is:

1. A program method of a nonvolatile memory device, comprising:
   detecting temperature;
   setting a step voltage, corresponding to an increment of a program voltage in a program operation of an incremental step pulse program (ISPP) method, wherein the step voltage changes based on the detected temperature; and
   performing the program operation and a program verification operation based on the set step voltage.

2. The program method of claim 1, wherein the setting a step voltage includes setting the step voltage to a lower step voltage than a previous step voltage according to a decrease in the detected temperature.

3. The program method of claim 1, wherein performing the program operation and the program verification operation comprises:
   performing a first program operation by supplying a first program voltage to a word line coupled to memory cells,
   performing a first program verification operation by comparing a target threshold voltage and threshold voltages of the memory cells, and
   performing a second program operation by supplying the word line with a second program voltage higher than the first program voltage by the step voltage.

4. The program method of claim 1, wherein setting the step voltage comprises:
   when the detected temperature is lower than a first temperature value, setting a first step voltage as the step voltage, and
   when the detected temperature is the first temperature value or higher, setting a second step voltage, which is higher than the first step voltage, as the step voltage.

5. A nonvolatile memory device, comprising:
   a memory cell block including memory cells coupled to each of word lines;
   an operation circuit group configured to perform a program operation of an incremental step pulse program (ISPP) method and a program verification operation for the memory cells; and
   a control circuit configured to set a step voltage, corresponding to an increment of a program voltage in the program operation, wherein the step voltage changes based on a detected temperature and to control the operation circuit group so that the program operation and the program verification operation are performed based on the set step voltage.

6. The nonvolatile memory device of claim 5, wherein the control circuit is configured to set the step voltage to a lower step voltage than the previous step voltage according to a decrease in the detected temperature.

7. The nonvolatile memory device of claim 5, further comprising a temperature sensing circuit for detecting the temperature.

8. The nonvolatile memory device of claim 5, wherein the control circuit is configured to control the operation circuit group such that a first program operation and a program verification operation are performed by supplying a first program voltage to the word line and a second program operation and a program verification operation are performed by supplying the word line with a second program voltage, which is higher than the first program voltage by the step voltage.

9. The nonvolatile memory device of claim 5, wherein the control circuit is configured to set a first step voltage as the step voltage when the detected temperature is lower than a first temperature value and set a second step voltage, which is higher than the first step voltage, as the step voltage when the detected temperature is the first temperature value or higher.

10. The nonvolatile memory device of claim 5, wherein the control circuit is configured to set a first step voltage as the step voltage when the detected temperature is lower than a first temperature value; set a second step voltage, which is higher than the first step voltage, as the step voltage when the detected temperature is the first temperature value or higher and lower than a second temperature value; and set a third step voltage, which is higher than the second step voltage, as the step voltage when the detected temperature is the second temperature value or higher.

\* \* \* \* \*